(12) United States Patent
Ikeda et al.

(10) Patent No.: US 10,945,337 B2
(45) Date of Patent: Mar. 9, 2021

(54) STEM

(71) Applicant: SHINKO ELECTRIC INDUSTRIES CO., LTD., Nagano (JP)

(72) Inventors: Takumi Ikeda, Nagano (JP); Yasuyuki Kimura, Nagano (JP); HanSu Kim, Jeollanam-do (KR); HaeRyong Ahn, Jeollanam-do (KR)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/702,705

(22) Filed: Dec. 4, 2019

(65) Prior Publication Data

US 2020/0187361 A1  Jun. 11, 2020

(30) Foreign Application Priority Data

Dec. 11, 2018 (JP) ............................. JP2018-231675

(51) Int. Cl.
*H05K 1/18* (2006.01)
*H05K 1/02* (2006.01)
*H05K 1/11* (2006.01)

(52) U.S. Cl.
CPC ........... *H05K 1/189* (2013.01); *H05K 1/0243* (2013.01); *H05K 1/116* (2013.01); *H05K 1/184* (2013.01); *H05K 2201/10863* (2013.01)

(58) Field of Classification Search
CPC ...... H05K 1/189; H05K 1/0243; H05K 1/184; H05K 1/116; H05K 1/147; H05K 1/028; H05K 2201/10863; H05K 5/0073; H05K 5/0095; H05K 2201/10962; H05K 2201/10189; H05K 2201/10378; H01S 5/02212; H01S 5/02236–02296; H01L 23/10; H01L 25/167; H01L 31/0232; H01L 31/0203; G02B 6/4201

USPC ....... 257/81, 432, 433, 434, 82, 99, 100, 98; 174/152 GM; 385/88, 92, 54, 58, 73, 76, 385/100

See application file for complete search history.

(56) References Cited

U.S. PATENT DOCUMENTS

| | | | | |
|---|---|---|---|---|
| 4,351,051 A | * | 9/1982 | van Alem | ............... H01S 5/024 372/36 |
| 5,223,672 A | * | 6/1993 | Pinneo | ................ B23K 20/129 156/73.5 |
| 6,476,464 B1 | * | 11/2002 | Greenspan | ............. H01L 23/10 102/202.2 |

(Continued)

FOREIGN PATENT DOCUMENTS

JP  2005-286305  10/2005

*Primary Examiner* — Roshn K Varghese
(74) *Attorney, Agent, or Firm* — Rankin, Hill & Clark LLP (57) ABSTRACT

A stem has a stem body that has a first surface to be placed on a flexible substrate, a second surface opposite to the first surface, and a through hole passing through the first surface and the second surface, a cylindrical body that is fitted into the through hole of the stem body, and a lead that is inserted into the cylindrical body and fixed to the cylindrical body with a fixing member and that has an end portion protruding from the first surface of the stem body. The cylindrical body has a protrusion that protrudes toward the flexible substrate from the first surface of the stem body and surrounds an outer circumferential surface of the end portion of the lead.

4 Claims, 8 Drawing Sheets

(56) References Cited

U.S. PATENT DOCUMENTS

| | | | |
|---|---|---|---|
| 6,707,073 B1* | 3/2004 | Yamamoto | H01S 5/02212 |
| | | | 257/100 |
| 8,053,803 B2* | 11/2011 | Kimura | H01L 23/055 |
| | | | 257/99 |
| 8,723,283 B2* | 5/2014 | Kang | G02B 6/4204 |
| | | | 257/433 |
| 10,135,223 B2* | 11/2018 | Noguchi | H01S 5/02276 |
| 2005/0194663 A1* | 9/2005 | Ishimura | H01S 5/0427 |
| | | | 257/666 |
| 2007/0190847 A1* | 8/2007 | Ichino | H01R 12/62 |
| | | | 439/495 |
| 2007/0228405 A1* | 10/2007 | Tateiwa | H01S 5/02212 |
| | | | 257/99 |
| 2014/0217570 A1* | 8/2014 | Hettler | H01L 23/66 |
| | | | 257/690 |
| 2014/0241388 A1* | 8/2014 | Yamanaka | H01L 23/045 |
| | | | 372/43.01 |

* cited by examiner

STEM

CROSS-REFERENCE TO RELATED APPLICATION

This application is based upon and claims the benefit of priority of the prior Japanese Patent Application No. 2018-231675, filed on Dec. 11, 2018, the entire contents of which are incorporated herein by reference.

FIELD

The embodiment discussed herein is related to a stem.

BACKGROUND

Stems on which semiconductor elements such as optical elements are mounted are conventionally placed on flexible printed circuits (FPCs) having flexibility and electrically connected to the FPCs. Specifically, leads protruding from the bottom of the stem are soldered to lands surrounding through holes formed on the FPC, resulting in the stem and the FPC being electrically connected.

An example of the conventional techniques is disclosed in Japanese Laid-open Patent Publication No. 2005-286305.

The FPC on which the stem is placed is formed of a material having flexibility. The FPC is, thus, deformed in a warped shape due to tensional forces in wiring patterns or solder resist on the front and the rear of the FPC, for example, in some cases. This deformation, thus, causes an uneven gap to be formed between the stem and the FPC when the leads of the stem and the lands on the FPC are soldered. When a gap is formed between the stem and the FPC, a high frequency signal propagating along the outer circumferential surface of the lead leaks into the gap between the stem and the FPC. As a result, high frequency signal resonance may occur in the gap between the stem and the FPC. The occurrence of the resonance in the gap between the stem and the FPC causes deterioration of a high frequency characteristic, which is not desirable.

SUMMARY

According to an aspect of an embodiment, a stem includes a stem body that has a first surface to be placed on a flexible substrate, a second surface opposite to the first surface, and a through hole passing through the first surface and the second surface; a cylindrical body that is fitted into the through hole of the stem body; and a lead that is inserted into the cylindrical body and fixed to the cylindrical body with a fixing member and that has an end portion protruding from the first surface of the stem body, wherein the cylindrical body has a protrusion that protrudes toward the flexible substrate from the first surface of the stem body and surrounds an outer circumferential surface of the end portion of the lead.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

The following describes an embodiment of a stem disclosed by the invention in detail with reference to the accompanying drawings. The following embodiment does not limit the disclosed technique. The same constituent elements in the embodiment are labeled with the same numerals and duplicated descriptions thereof are omitted.

Stem Structure

Figure 1:
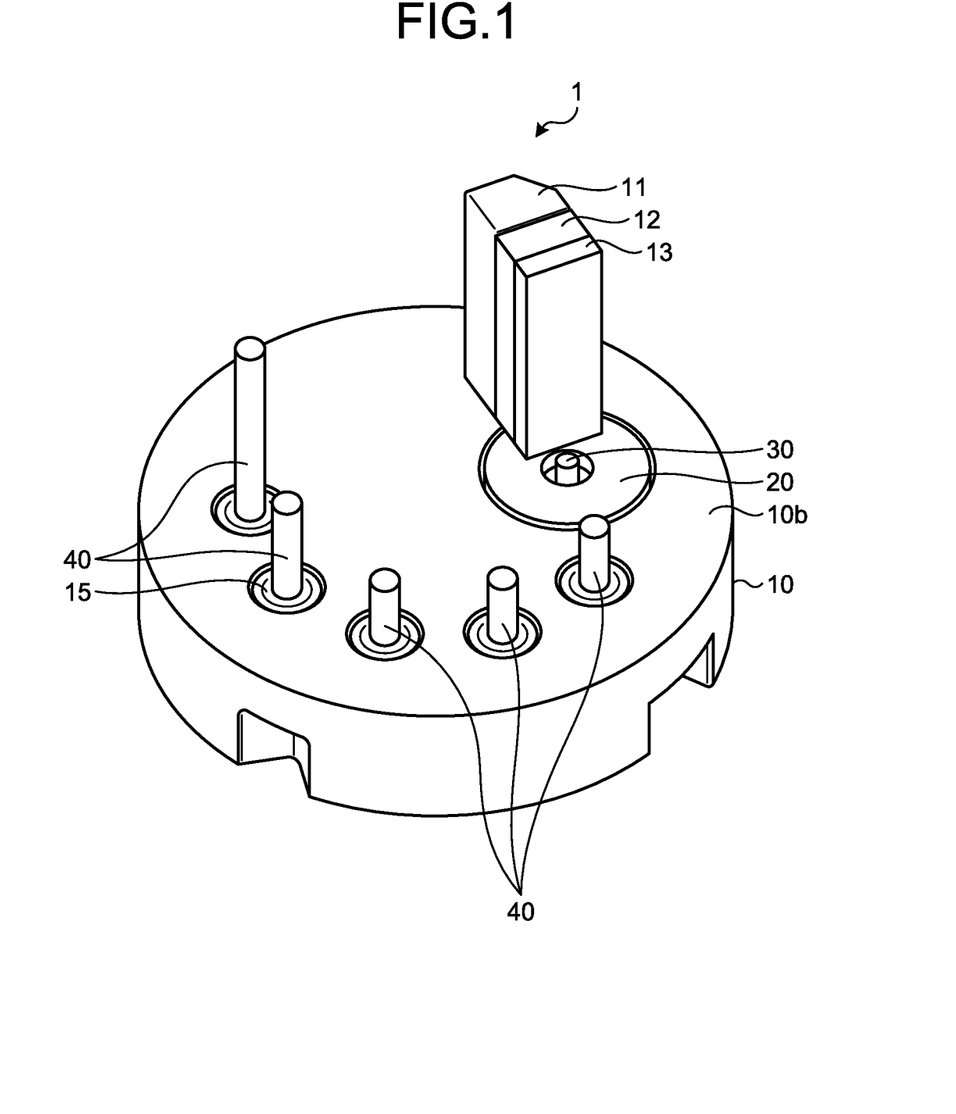
FIG. 1 is a perspective view of a stem according to an embodiment when viewed from the upper surface side thereof.
Figure 2:
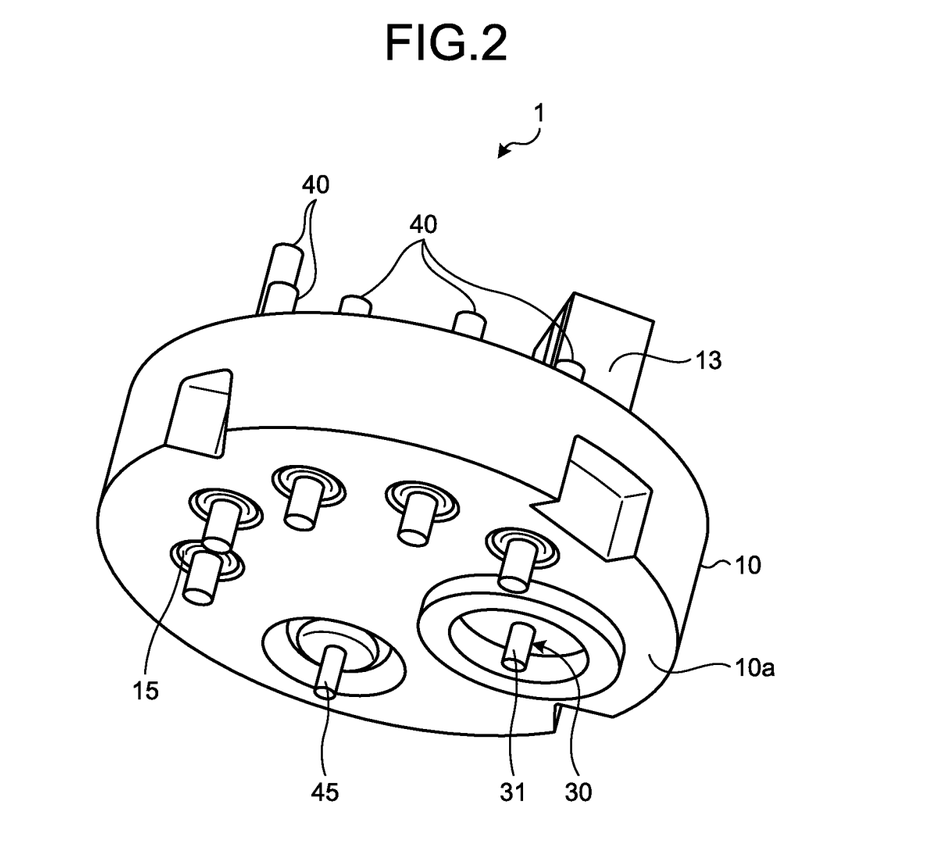
FIG. 2 is a perspective view of the stem according to the embodiment when viewed from the lower surface side thereof.
Figure 3:
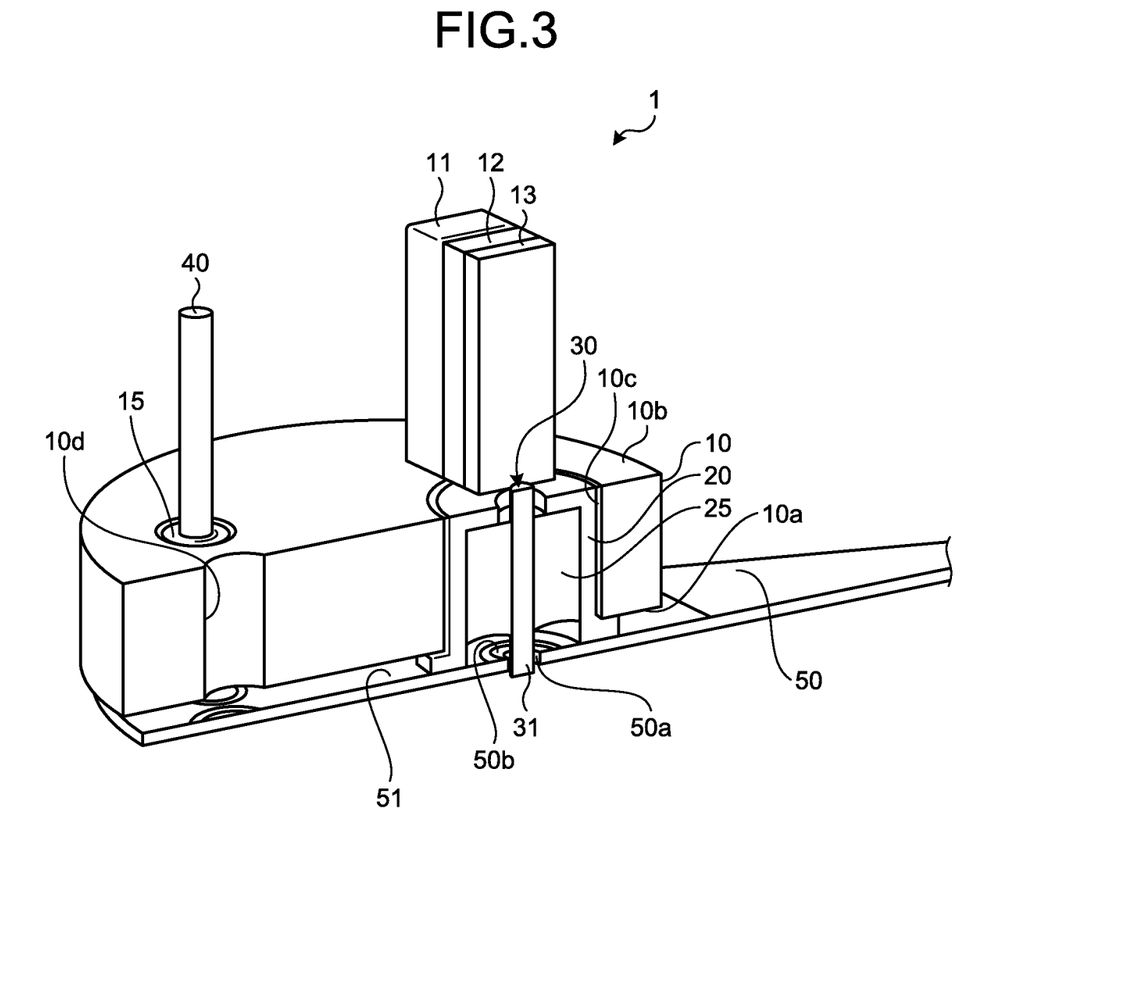
FIG. 3 is a diagram illustrating a state where the stem according to the embodiment is placed on an FPC.

FIG. 1 is a perspective view of a stem 1 according to the embodiment when viewed from the upper surface side thereof. FIG. 2 is a perspective view of the stem 1 according to the embodiment when viewed from the lower surface side thereof. FIG. 3 is a diagram illustrating a state where the stem 1 according to the embodiment is placed on an FPC 50. FIG. 3 illustrates side cross sections of the stem 1 and the FPC 50 for the purpose of explanation. The stem 1, which is illustrated in each of FIGS. 1 to 3, is placed on the FPC 50, which is a flexible substrate having flexibility, and electrically connected to the FPC 50. The stem 1 has a stem body 10, a cylindrical body 20, a high frequency signal lead 30, various power supply leads 40, and a case grounding lead 45.

The stem body 10 is formed of a metallic material such as iron taking heat dissipation and a cost into consideration, for example. The stem body 10 is a base material on which various parts constituting the stem 1 are mounted. The stem body 10, which is formed in a disk shape, has a lower surface 10a to be placed on the FPC 50, and an upper surface 10b opposite the lower surface 10a. The upper surface 10b serves as a mounting surface on which a semiconductor element (not illustrated) such as an optical element is mounted. The stem body 10 has a through hole 10c and a through hole 10d that pass through the lower surface 10a and the upper surface 10b. At a position near the through hole 10c on the upper surface 10b, a rising portion 11 is formed. A side surface located on the through hole 10c side of the rising portion 11 serves as an attachment surface to which a substrate 13 is attached with a spacer 12 interposed therebetween. The substrate 13 is electrically connected to the high frequency signal lead 30, and relays an electrical signal propagating in the high frequency signal lead 30 to the semiconductor element mounted on the upper surface 10b.

The cylindrical body 20 is fitted into the through hole 10c of the stem body 10. The cylindrical body 20 has an internal space into which the high frequency signal lead 30 is inserted, for example. Kovar is used as a material of the cylindrical body 20, for example.

The high frequency signal lead 30, which is formed in a cylindrical shape, for example, transmits the electrical signal, which is a high frequency signal. The high frequency signal lead 30 is inserted into the cylindrical body 20 and fixed to the cylindrical body 20 with a fixing member 25. The fixing member 25 covers and seals the outer circumferential surface, which corresponds to the inner side surface of the cylindrical body 20, of the high frequency signal lead 30. The fixing member 25 has a relative dielectric constant lower than that of a fixing member 15 that fixes each of the various power supply leads 40 to the stem body 10. The use of the fixing member 25 having a low relative dielectric constant can prevent an increase in outer diameter of the fixing member 25, thereby making it possible to prevent an increase in inner diameter of the cylindrical body 20. Hard glass is used for the fixing member 25, for example.

A lower end portion 31 of the high frequency signal lead 30 protrudes from the lower surface 10a of the stem body 10. The lower end portion 31 passes through a through hole 50a formed on the FPC 50 in a state where the stem 1 is placed on a grounding pattern 51 of the FPC 50.

Figure 4:
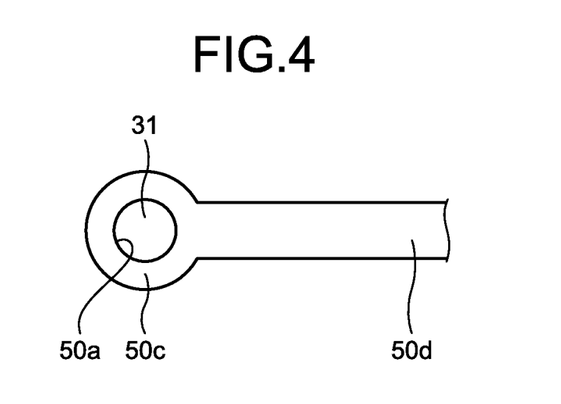
FIG. 4 is a plan view illustrating a structure of a surface opposite a grounding pattern of the FPC.

FIG. 4 is a plan view illustrating a structure of a surface opposite the grounding pattern 51 of the FPC 50. On the surface on the grounding pattern 51 side of the FPC 50, as illustrated in FIG. 3, a reception land 50b surrounding the through hole 50a is formed. On the surface opposite the grounding pattern 51 of the FPC 50, as illustrated in FIG. 4, a connection land 50c surrounding the through hole 50a is formed. On the surface opposite the grounding pattern 51 of the FPC 50, a wiring pattern 50d propagating the electrical signal is formed. The wiring pattern 50d is connected to the connection land 50c surrounding the through hole 50a. The lower end portion 31 of the high frequency signal lead 30 after passing through the through hole 50a is soldered to the connection land 50c surrounding the through hole 50a. As a result, the stem 1 and the FPC 50 are electrically connected.

Referring back to FIGS. 1 to 3 for explaining, the various power supply leads 40 are formed in a cylindrical shape, for example. The various power supply leads 40 monitor or control the semiconductor element mounted on the upper surface 10b of the stem body 10. Each of the various power supply leads 40 is inserted into the through hole 10d of the stem body 10 and fixed to the through hole 10d with the fixing member 15. The fixing member 15 covers and seals the outer circumferential surface, which corresponds to the through hole 10d, of each of the various power supply leads 40. Soft glass suitable for sealing with iron is used for the fixing member 15, for example.

The case grounding lead 45, which is formed in a cylindrical shape, for example, grounds the stem body 10. The case grounding lead 45 is bonded to the lower surface 10a of the stem body 10 by welding, for example.

Connecting Portion Between Stem and FPC

Figure 5:
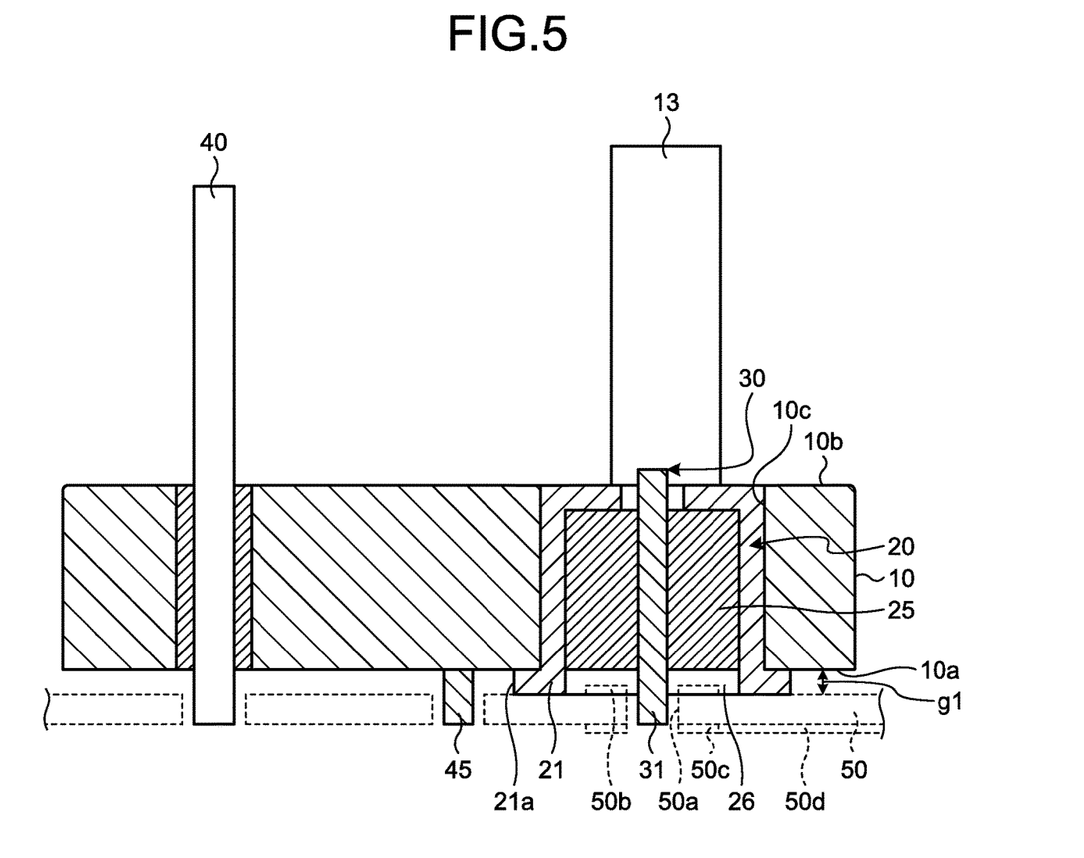
FIG. 5 is a side cross-sectional view illustrating a structure of a connecting portion between the stem and the FPC.

The following describes the connecting portion between the stem 1 and the FPC 50 in detail with reference to FIG. 5. FIG. 5 is a side cross-sectional view illustrating the structure of the connecting portion between the stem 1 and the FPC 50. As described above, the stem 1 is structured such that the cylindrical body 20 is fitted into the through hole 10c of the stem body 10. The high frequency signal lead 30 is fixed to the cylindrical body 20 with the fixing member 25. The lower end portion 31 of the high frequency signal lead 30 protrudes from the lower surface 10a of the stem body 10 and is soldered to the connection land 50c surrounding the through hole 50a of the FPC 50.

The cylindrical body 20 has a protrusion 21 that protrudes toward the FPC 50 from the lower surface 10a of the stem body 10 in a certain length. The protrusion 21 surrounds the outer circumferential surface of the lower end portion 31 of the high frequency signal lead 30. The protrusion 21 is bonded to the grounding pattern 51 of the FPC 50 in a state where the stem 1 is placed on the grounding pattern 51 (refer to FIG. 3) of the FPC 50. The protrusion 21 has a flange 21a protruding outside the cylindrical body 20 in a radius direction on the outer side surface thereof. When the protrusion 21 and the grounding pattern 51 of the FPC 50 are bonded, the flange 21a of the protrusion 21 is soldered to the grounding pattern 51 of the FPC 50. As a result, the protrusion 21 and the grounding pattern 51 of the FPC 50 are more firmly bonded.

The cylindrical body 20 has an air layer 26 which is not filled with the fixing member 25 between the protrusion 21 and the outer circumferential surface of the lower end portion 31 of the high frequency signal lead 30. Inside the protrusion 21 of the cylindrical body 20, a coaxial line (hereinafter called an "air coaxial line") is formed that is the air layer 26 covering the surrounding of the lower end portion 31 of the high frequency signal lead 30. The connection land 50c, to which the lower end portion 31 of the high frequency signal lead 30 is soldered, of the FPC 50 has a width larger than that of the wiring pattern 50d of the FPC 50 in general. This structure locally reduces characteristic impedance relating to the FPC 50. In contrast, the air coaxial line formed inside the protrusion 21 of the cylindrical body 20 can increase the characteristic impedance on the upper side of the connection land 50c of the FPC 50. The air layer 26, thus, can correct a decrease in characteristic impedance occurring on the connection land 50c of the FPC 50.

The FPC 50, on which the stem 1 is placed, is formed of a flexible material. The FPC 50 may be deformed in a warped shape due to tensional forces in wiring patterns or solder resist on the front and the rear of the FPC 50, for example, in some cases. This deformation, thus, causes an uneven gap to be formed between the stem 1 and the FPC 50 when the lower end portion 31 of the high frequency signal lead 30 of the stem 1 and the connection land 50c surrounding the through hole 50a of the FPC 50 are soldered. When a gap is formed between the stem 1 and the FPC 50, the high frequency signal (i.e., the electrical signal) propagating along the outer circumferential surface of the high frequency signal lead 30 leaks into the gap between the stem 1 and the FPC 50. As a result, high frequency signal resonance may occur in the gap between the stem 1 and the FPC 50.

As illustrated in FIG. 5, in the stem 1 according to the embodiment, the cylindrical body 20 to which the high frequency signal lead 30 is fixed is fitted into the through hole 10c of the stem body 10, and the cylindrical body 20 has the protrusion 21 that surrounds the outer circumferential surface of the lower end portion 31 of the high frequency signal lead 30. This structure makes it possible to bond the protrusion 21 to the grounding pattern 51 of the FPC 50 in a state where the stem 1 is placed on the grounding pattern 51 of the FPC 50. This causes the protrusion 21 of the cylindrical body 20 to separate the gap which has width g1 between the stem 1 and the FPC 50 and the outer circumferential surface of the lower end portion 31 of the high frequency signal lead 30. As a result, the situation is avoided where the high frequency signal propagating along the outer circumferential surface of the high frequency signal lead 30 leaks into the gap which has width g1 between the stem 1 and the FPC 50. This makes it possible to prevent the occurrence of resonance in the gap which has width g1 between the stem 1 and the FPC 50.

Figure 6:
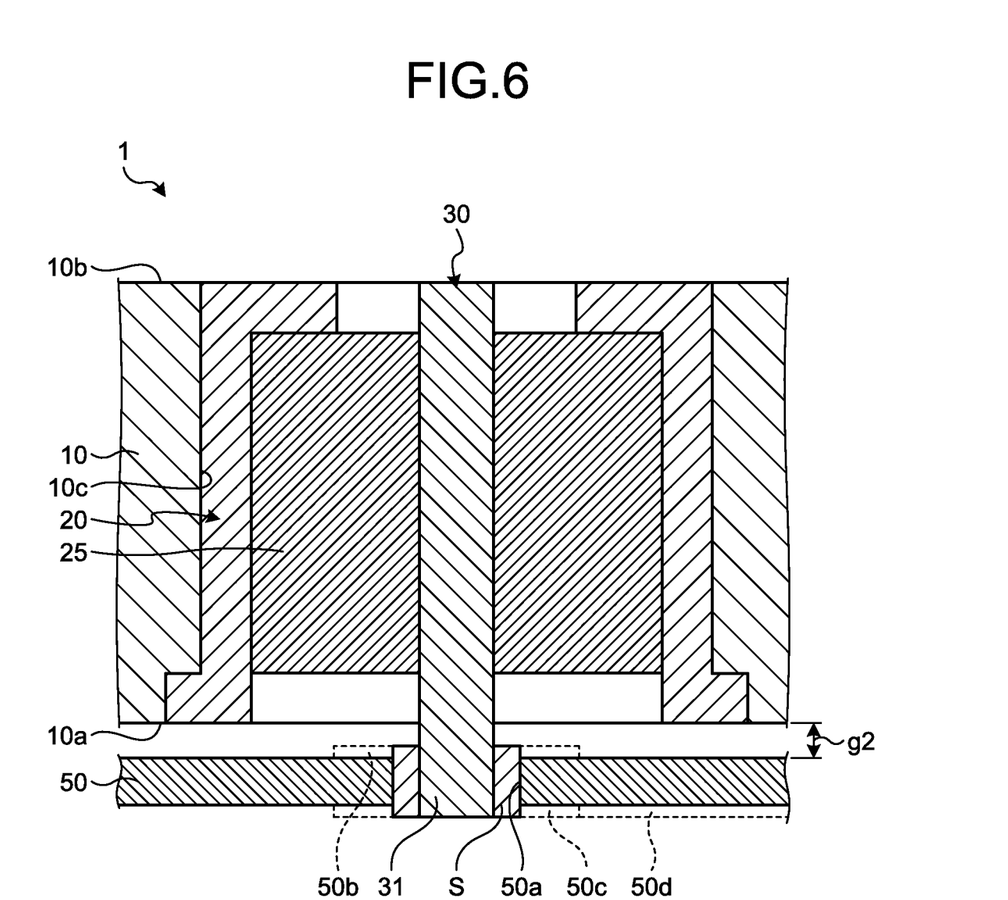
FIG. 6 is a diagram illustrating an exemplary simulation model used for simulating changes in transfer characteristics of a high frequency signal in the stem.
Figure 7:
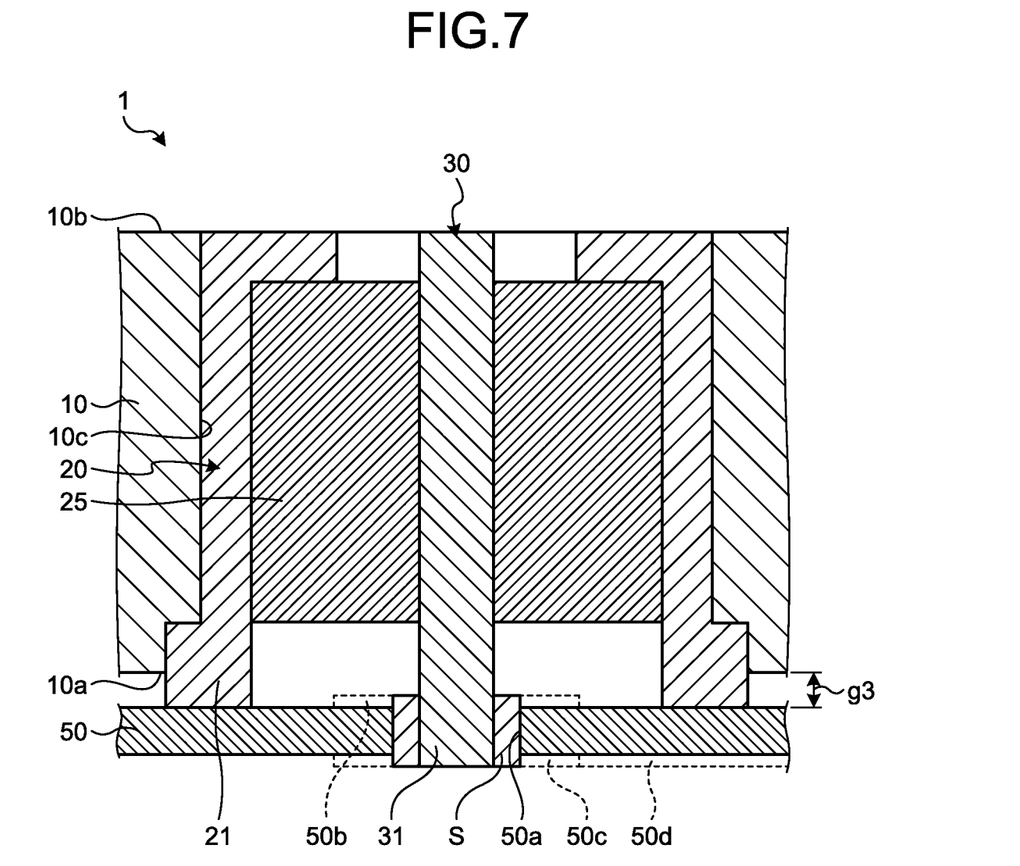
FIG. 7 is a diagram illustrating another exemplary simulation model used for simulating changes in transfer characteristics of the high frequency signal in the stem.

Simulation of Changes in Transfer Characteristics of High Frequency Signal Caused by Protrusion The following describes changes in transfer characteristics (a transmission characteristic S21 and a reflection characteristic S11) of the high frequency signal in the stem 1 caused by the protrusion 21 formed to the cylindrical body 20. FIGS. 6 and 7 are diagrams illustrating exemplary simulation models used for simulating changes in transfer characteristics of the high frequency signal in the stem 1. As illustrated in FIGS. 6 and 7, the stem body 10 of the stem 1 has the through hole 10c, into which the cylindrical body 20 is fitted. The high frequency signal lead 30 is fixed to the cylindrical body 20 with the fixing member 25. The lower end portion 31 of the high frequency signal lead 30 protrudes downward from the lower surface 10a of the stem body 10 and is connected to the connection land 50c surrounding the through hole 50a of the FPC 50 with a solder S. A width g2 of the gap between the stem 1 and the FPC 50 is varied due to a warpage or deformation of the FPC 50. FIG. 6 illustrates a state where the cylindrical body 20 does not have the protrusion 21. FIG. 7 illustrates a state where the cylindrical body 20 has the protrusion 21. In the simulation model illustrated in FIG. 7, the length of the protrusion 21 is changed, thus the width g3 of the gap between the stem 1 and the FPC 50 is changed.

Figure 8:
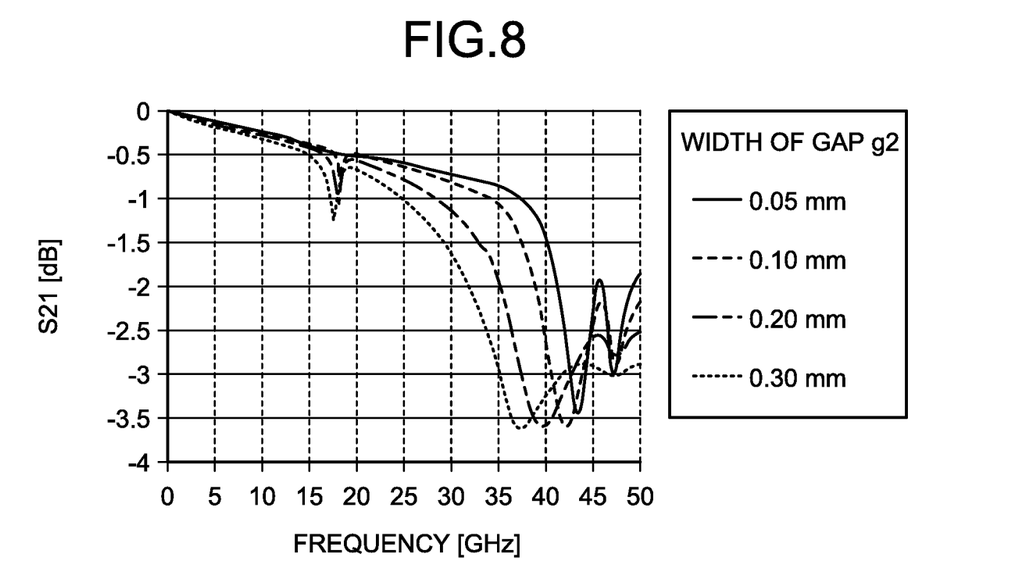
FIG. 8 is a diagram illustrating a result of changes in a transmission characteristic S21 of the high frequency signal at the respective frequencies using the simulation model illustrated in FIG. 6.
Figure 9:
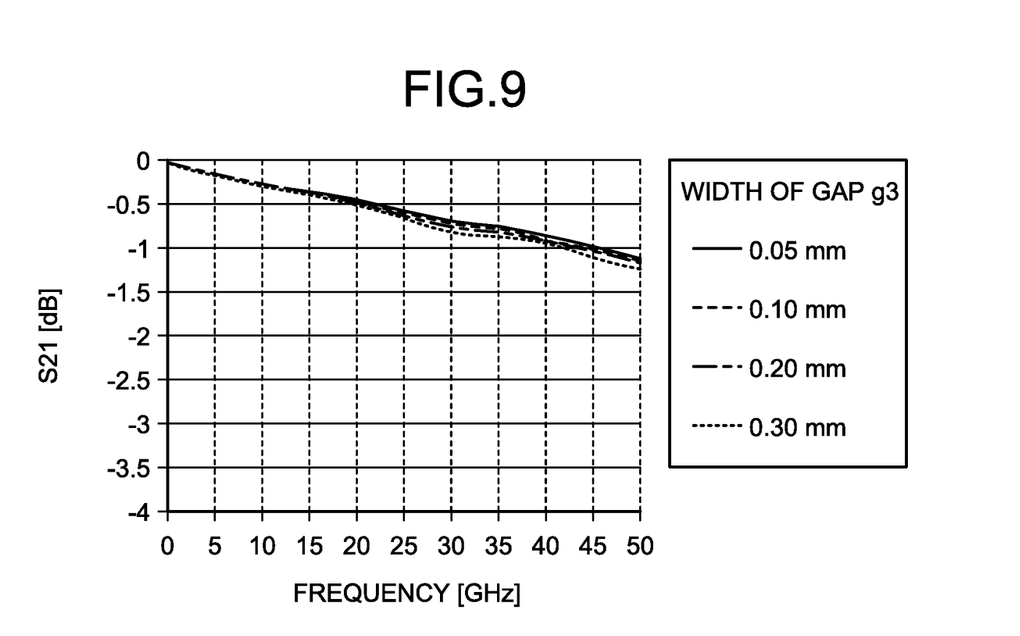
FIG. 9 is a diagram illustrating a result of changes in the transmission characteristic S21 of the high frequency signal at the respective frequencies using the simulation model illustrated in FIG. 7.

FIG. 8 is a diagram illustrating a result of changes in the transmission characteristic S21 of the high frequency signal at the respective frequencies using the simulation model illustrated in FIG. 6. FIG. 9 is a diagram illustrating a result of changes in the transmission characteristic S21 of the high frequency signal at the respective frequencies using the simulation model illustrated in FIG. 7. FIG. 8 illustrates the changes in the transmission characteristic S21 when the cylindrical body 20 does not have the protrusion 21. FIG. 9 illustrates the changes in the transmission characteristic S21 when the cylindrical body 20 has the protrusion 21. FIGS. 8 and 9 each illustrate the changes in the transmission characteristic S21 with respect to the respective frequencies of the high frequency signal for each width g2, g3 of the gap between the stem 1 and the FPC 50. As illustrated in FIG. 8, when the cylindrical body 20 does not have the protrusion 21, the transmission characteristic S21 is largely changed as the frequency of the high frequency signal increases. It is thus observed that resonance occurs in the gap between the stem 1 and the FPC 50 when the cylindrical body 20 does not have the protrusion 21.

As illustrated in FIG. 9, when the cylindrical body 20 has the protrusion 21, no significant deterioration of the transmission characteristic S21 is observed around 17 GHz and in a range from 36 to 50 GHz, because the protrusion 21 prevents the leakage of the high frequency signal from the outer circumferential surface of the high frequency signal lead 30. It is thus observed that resonance in the gap between the stem 1 and the FPC 50 is prevented when the cylindrical body 20 has the protrusion 21.

Figure 10:
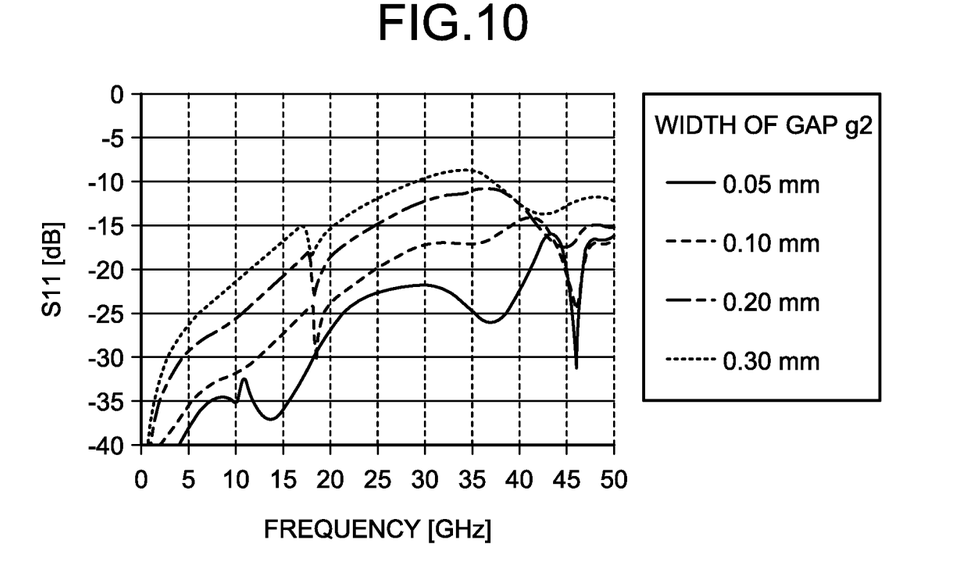
FIG. 10 is a diagram illustrating a result of changes in the reflection characteristic S11 of the high frequency signal at the respective frequencies using the simulation model illustrated in FIG. 6.
Figure 11:
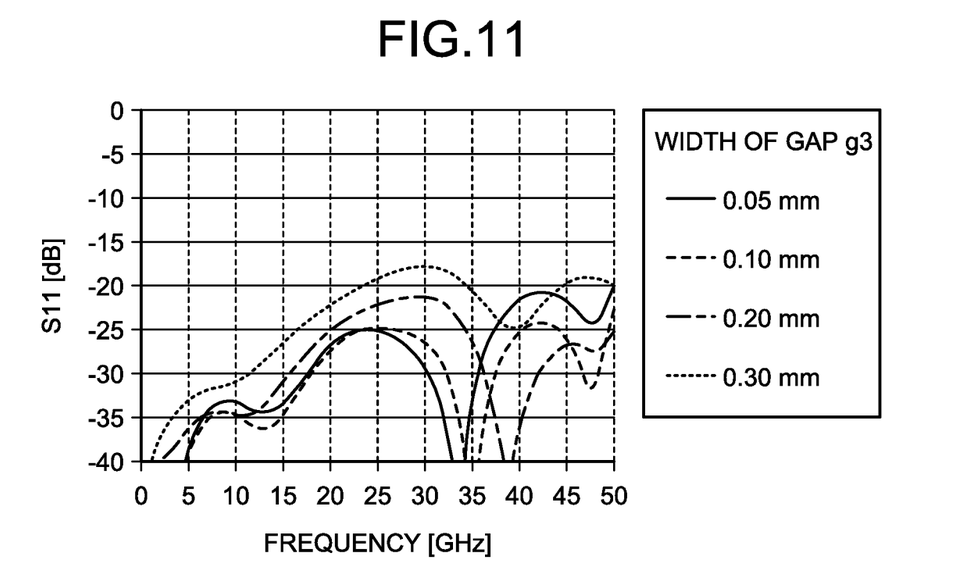
FIG. 11 is a diagram illustrating a result of changes in the reflection characteristic S11 of the high frequency signal at the respective frequencies using the simulation model illustrated in FIG. 7.

FIG. 10 is a diagram illustrating a result of changes in the reflection characteristic S11 of the high frequency signal at the respective frequencies using the simulation model illustrated in FIG. 6. FIG. 11 is a diagram illustrating a result of changes in the reflection characteristic S11 of the high frequency signal at the respective frequencies using the simulation model illustrated in FIG. 7. FIG. 10 illustrates the changes in the reflection characteristic S11 when the cylindrical body 20 does not have the protrusion 21. FIG. 11 illustrates the changes in the reflection characteristic S11 when the cylindrical body 20 has the protrusion 21. FIGS. 10 and 11 each illustrate the changes in the reflection characteristic S11 with respect to the respective frequencies of the high frequency signal for each width g2, g3 of the gap between the stem 1 and the FPC 50. As illustrated in FIG. 10, when the cylindrical body 20 does not have the protrusion 21, the reflection characteristic S11 is increased as the frequency of the high frequency signal increases, because resonance occurs in the gap between the stem 1 and the FPC 50.

As illustrated in FIG. 11, when the cylindrical body 20 has the protrusion 21, an increase in the reflection characteristic S11 is prevented, because resonance in the gap between the stem 1 and the FPC 50 is prevented.

As described above, the stem 1 according to the embodiment has the stem body 10, the cylindrical body 20, and the high frequency signal lead 30. The stem body 10 has the lower surface 10a to be placed on the FPC 50, the upper surface 10b opposite the lower surface 10a, and the through hole 10c that passes through the lower surface 10a and the upper surface 10b. The cylindrical body 20 is fitted into the through hole 10c of the stem body 10. The high frequency signal lead 30 is inserted into the cylindrical body 20 and fixed to the cylindrical body 20 with the fixing member 25. The lower end portion 31 of the high frequency signal lead 30 protrudes from the lower surface 10a of the stem body 10. The cylindrical body 20 has the protrusion 21 that protrudes toward the FPC 50 from the lower surface 10a of the stem body 10 and surrounds the outer circumferential surface of the lower end portion 31 of the high frequency signal lead 30. This structure prevents the occurrence of resonance in the gap between the stem 1 and the FPC 50 on which the stem 1 is placed, thereby making it possible to improve the transmission characteristic.

In the stem 1 according to the embodiment, the protrusion 21 is bonded to the grounding pattern 51 of the FPC 50. The protrusion 21 having ground potential prevents the leakage of the high frequency signal from the outer circumferential surface of the high frequency signal lead 30, thereby making it possible to more stably prevent the occurrence of resonance in the gap between the stem 1 and the FPC 50.

In the stem 1 according to the embodiment, the cylindrical body 20 has the air layer 26 that is not filled with the fixing member 25 between the protrusion 21 and the outer circumferential surface of the lower end portion 31 of the high frequency signal lead 30. The air layer 26 can correct a decrease in characteristic impedance occurring on the connection land 50c of the FPC 50.

An aspect of the stem disclosed by the invention has an advantageous effect of capable of preventing the occurrence of resonance in the gap between the stem and the flexible substrate on which the stem is placed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A stem, comprising: a stem body that has a first surface to be placed on a flexible substrate, a second surface opposite to the first surface, and a through hole passing through the first surface and the second surface; a cylindrical body that is fitted into the through hole of the stem body; and a lead that is inserted into the cylindrical body and fixed to the cylindrical body with a fixing member and that has an end portion protruding from the first surface of the stem body, wherein the cylindrical body has a protrusion that protrudes toward the flexible substrate from the first surface of the stem body, surrounds an outer circumferential surface of the end portion of the lead, and separates, with the stem body placed on the flexible substrate, a gap between the stem body and the flexible substrate, and the outer circumferential surface of the end portion of the lead, and a length of the protrusion, in a direction extending perpendicularly from the first surface of the stem body, defines a width of the gap, in the direction extending perpendicularly from the first surface of the stem body, between the stem body and the flexible substrate on which the stem body is placed, wherein, with the stem body placed on the flexible substrate, the protrusion directly contacts the flexible substrate.

2. The stem according to claim 1, wherein the protrusion is to be bonded to a grounding pattern of the flexible substrate.

3. The stem according to claim 1, wherein the cylindrical body has an air layer that is not filled with the fixing member between the protrusion and the outer circumferential surface of the end portion of the lead.

4. The stem according to claim 1, wherein
the lead transmits a high frequency signal, and
the fixing member has a relative dielectric constant lower than a relative dielectric constant of another fixing member that fixes another lead different from the lead.

* * * * *